US009507251B2

(12) United States Patent
Yoshimori et al.

(10) Patent No.: US 9,507,251 B2
(45) Date of Patent: Nov. 29, 2016

(54) METHOD FOR MANUFACTURING REFLECTIVE MASK AND APPARATUS FOR MANUFACTURING REFLECTIVE MASK

(71) Applicants: Shibaura Mechatronics Corporation, Yokohama-shi, Kanagawa-ken (JP); Kabushiki Kaisha Toshiba, Tokyo (JP)

(72) Inventors: Tomoaki Yoshimori, Kanagawa-ken (JP); Makoto Karyu, Kanagawa-ken (JP); Takeharu Motokawa, Kanagawa-ken (JP); Kosuke Takai, Kanagawa-ken (JP); Yoshihisa Kase, Kanagawa-ken (JP)

(73) Assignees: SHIBAURA MECHATRONICS CORPORATION, Yokohama-Shi (JP); KABUSHIKI KAISHA TOPCON, Tokyo (JP)

( * ) Notice: Subject to any disclaimer, the term of this patent is extended or adjusted under 35 U.S.C. 154(b) by 199 days.

(21) Appl. No.: 14/197,549

(22) Filed: Mar. 5, 2014

(65) Prior Publication Data
US 2014/0186754 A1 Jul. 3, 2014

Related U.S. Application Data

(62) Division of application No. 13/300,722, filed on Nov. 21, 2011, now Pat. No. 8,702,901.

(30) Foreign Application Priority Data

Nov. 22, 2010 (JP) .................................. 2010-259851
Nov. 4, 2011 (JP) .................................. 2011-242366

(51) Int. Cl.
*G03F 1/24* (2012.01)
*G03B 27/42* (2006.01)
(Continued)

(52) U.S. Cl.
CPC .................. *G03F 1/24* (2013.01); *G03B 27/42* (2013.01); *G03F 1/54* (2013.01); *G03F 1/80* (2013.01)

(58) Field of Classification Search
CPC .............. G03F 1/24; G03F 1/54; G03F 1/80; G03B 27/42
See application file for complete search history.

(56) References Cited

U.S. PATENT DOCUMENTS 4,478,678 A * 10/1984 Watanabe ................. C23F 4/00
                                              204/192.34
6,211,081 B1    4/2001 Mikata
(Continued)

FOREIGN PATENT DOCUMENTS

JP         59-162276 A    9/1984
JP         63-085553 A    4/1988
(Continued)

OTHER PUBLICATIONS

Fukuda JP01212778 (1989) Translation of Abstract.*
(Continued)

*Primary Examiner* — Nadine Norton
*Assistant Examiner* — Mahmoud Dahimene
(74) *Attorney, Agent, or Firm* — Pearne & Gordon LLP

(57) ABSTRACT

According to one embodiment, a method is disclosed for manufacturing a reflective mask. The method can include forming a reflection layer on a major surface of a substrate. The method can include forming an absorption layer on the reflection layer. The method can include forming a pattern region in the absorption layer. In addition, the method can include forming a light blocking region surrounding the pattern region in the absorption layer and the reflection layer. The forming the light blocking region includes etching-processing the reflection layer using a gas containing chlorine and oxygen.

10 Claims, 8 Drawing Sheets

(51) Int. Cl.
*G03F 1/54* (2012.01)
*G03F 1/80* (2012.01)

(56) References Cited

U.S. PATENT DOCUMENTS

| 7,932,002 | B2 | 4/2011 | Takai | |
|---|---|---|---|---|
| 2003/0039922 | A1 | 2/2003 | Han | |
| 2009/0214961 | A1 | 8/2009 | Nozawa | |
| 2011/0059391 | A1* | 3/2011 | Shoki | B82Y 10/00 430/5 |

FOREIGN PATENT DOCUMENTS

| JP | 01212778 | * | 8/1989 | C23F 4/00 |
| JP | 11-236686 A | | 8/1999 | |
| JP | 2009-212220 A | | 9/2009 | |
| JP | WO2009136564 | * | 11/2009 | B82Y 10/00 |
| TW | 583721 | | 4/2004 | |
| TW | 201031999 A1 | | 9/2010 | |
| WO | 2009/136564 A1 | | 11/2009 | |

OTHER PUBLICATIONS

Office Action issued in corresponding Taiwanese Patent Application No. 100142797 dated May 27, 2014.
Korean Office Action for 10-2011-0122519 dated Apr. 17, 2013.
Japanese Office action for 2011-242366 dated Sep. 7, 2015.
Japanese Office action for 2011-242366 dated Mar. 25, 2016.

* cited by examiner

METHOD FOR MANUFACTURING REFLECTIVE MASK AND APPARATUS FOR MANUFACTURING REFLECTIVE MASK

CROSS-REFERENCE TO RELATED APPLICATIONS

This application is based upon and claims the benefit of priority from the prior Japanese Patent Application No. 2010-259851, filed on Nov. 22, 2010 and Japanese Patent Application No. 2011-242366, filed on Nov. 4, 2011; the entire contents of which are incorporated herein by reference.

FIELD

Embodiments described herein relate generally to a method for manufacturing a reflective mask and an apparatus for manufacturing the reflective mask.

BACKGROUND

An EUV lithography method using extreme ultraviolet (EUV) to perform the transfer of microscopic patterns is proposed.

In the manufacturing of a reflective mask used for the EUV lithography method, a reflection layer, a capping layer (also called a stopper layer etc.), and an absorption layer are sequentially formed on the major surface of a substrate, and the absorption layer is etching-processed; thereby, a pattern region including a desired pattern is formed. Then, the absorption layer, the capping layer, and the reflection layer are etching-processed to form a light blocking region (also called a light blocking frame etc.) surrounding the pattern region.

However, there are problems that the dimensional controllability in the etching processing of the reflection layer, the capping layer, and the absorption layer is low and the re-formation of a resist pattern is required, which lead to a low productivity.

BRIEF DESCRIPTION OF THE DRAWINGS

FIGS. 2A to 2C are schematic process cross-sectional views for illustrating the formation of a pattern region, and FIGS. 2D to 2H are schematic process cross-sectional views for illustrating the formation of a light blocking region;

DETAILED DESCRIPTION

Figure 1:
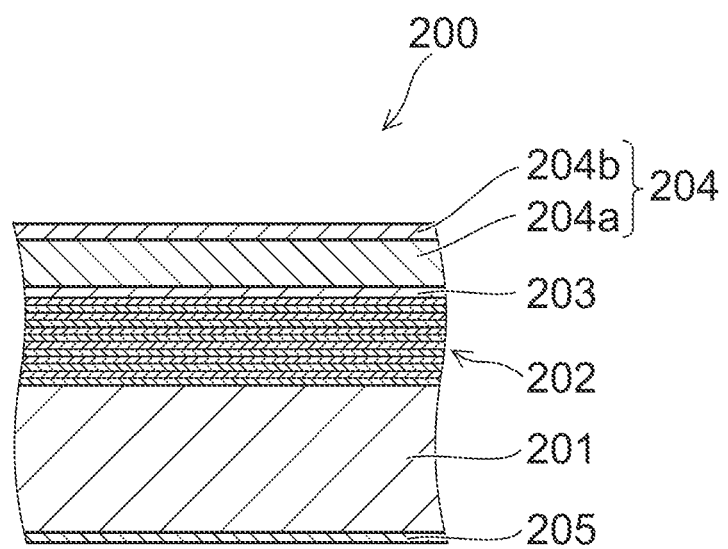
FIG. 1 is a schematic cross-sectional view for illustrating a mask blank.

According to one embodiment, a method is disclosed for manufacturing a reflective mask. The method can include forming a reflection layer on a major surface of a substrate. The method can include forming an absorption layer on the reflection layer. The method can include forming a pattern region in the absorption layer. In addition, the method can include forming a light blocking region surrounding the pattern region in the absorption layer and the reflection layer. The forming the light blocking region includes etching-processing the reflection layer using a gas containing chlorine and oxygen.

Hereinbelow, embodiments are illustrated with reference to the drawings. In the drawings, like components are marked with the same reference numerals, and a detailed description is omitted as appropriate.

First Embodiment

Manufacturing of a Mask Blank

FIG. 1 is a schematic cross-sectional view for illustrating a mask blank.

First, a mask blank 200 used for manufacturing a reflective mask 210 is manufactured.

As shown in FIG. 1, a reflection layer 202, a capping layer 203, and an absorption layer 204 are formed on one major surface of a substrate 201 provided in the mask blank 200 so as to be stacked in this order. A conductive layer 205 is formed on the other major surface of the substrate 201.

The substrate 201 is formed of a transparent material. The substrate 201 may be formed of, for example, a low thermal expansion material (LTEM), quartz, or the like.

The reflection layer 202 is formed in order to reflect extreme ultraviolet that is exposure light. The reflection layer 202 is formed to have a configuration in which molybdenum (Mo) layers and silicon (Si) layers are alternately stacked. The reflection layer 202 may have a configuration in which approximately 40 to 50 sets of a molybdenum (Mo) layer and a silicon (Si) layer are stacked.

The capping layer 203 is formed in order to protect the reflection layer 202. The capping layer 203 may include, for example, silicon (Si), ruthenium (Ru), titanium oxide (TiO), or the like. In the case of forming the capping layer 203 out of silicon (Si), the silicon (Si) layer that forms the uppermost layer of the reflection layer 202 may be formed thick to form the capping layer 203.

The absorption layer 204 is formed in order to suppress the reflection of extreme ultraviolet that is exposure light. The absorption layer 204 includes an absorber layer 204a and an anti-reflection layer 204b.

The absorber layer 204a absorbs extreme ultraviolet that is exposure light. The absorber layer 204a may include, for example, a nitride of tantalum (e.g., tantalum boron nitride (TaBN), tantalum nitride (TaN), etc.), a nitride of chromium (e.g., chromium nitride (CrN) etc.), or the like.

The anti-reflection layer 204b functions as an anti-reflection layer (AR layer) for inspection light of a wavelength around 250 nm. The anti-reflection layer 204b may include, for example, an oxide of tantalum (e.g., tantalum boron oxide (TaBO), tantalum oxide (TaO), etc.), an oxide of chromium (e.g., chromium oxide ($CrO_x$) etc.), or the like.

The conductive layer 205 is formed in order that the reflective mask can be held by an electrostatic chuck. The conductive layer 205 may include, for example, chromium nitride (CrN) or the like.

Known film-formation methods such as a sputtering method may be used for the formation of the reflection layer 202, the capping layer 203, the absorption layer 204, and the conductive layer 205.

For example, the manufacturing of the mask blank 200 may include forming the reflection layer 202 on a major surface of the substrate 201, forming the absorption layer 204 above the reflection layer 202, forming the capping layer 203 between the reflection layer 202 and the absorption layer 204, etc.

For example, the sputtering method or the like may be used to form the reflection layer 202 having a total thickness of approximately 280 nm, form the capping layer 203 having a thickness of approximately 10 nm, form the absorption layer 204 having a total thickness of approximately 70 nm, and form the conductive layer 205 having a thickness of approximately 10 nm. However, the thicknesses of the layers are not limited to those illustrated, but may be altered as appropriate. Known technology may be applied to the film-formation conditions etc. in the case of using the sputtering method, and details of the film-formation conditions etc. are therefore omitted.

A not-shown buffer layer may be formed between the capping layer 203 and the absorber layer 204a. The not-shown buffer layer functions as an etching stop layer when the absorber layer 204a and the anti-reflection layer 204b are etching-processed to form a pattern. The not-shown buffer layer may include, for example, chromium (Cr) or the like. In the case where the capping layer 203 is formed of ruthenium (Ru), the not-shown buffer layer does not need to be provided. In the case where the anti-reflection layer 204b is formed of an oxide of chromium, the not-shown buffer layer may be formed of a material capable of functioning as an etching stop layer other than chromium.

(Manufacturing of the Reflective Mask)

Next, the reflective mask 210 is manufactured from the mask blank 200 thus manufactured.

Herein, as an example, the case is illustrated where the substrate 201 is formed of a low thermal expansion material (LTEM), the reflection layer 202 includes a molybdenum (Mo) layer and a silicon (Si) layer, the capping layer 203 is formed of silicon (Si), the absorber layer 204a is formed of tantalum boron nitride (TaBN), and the anti-reflection layer 204b is formed of tantalum boron oxide (TaBO).

Figure 2A:
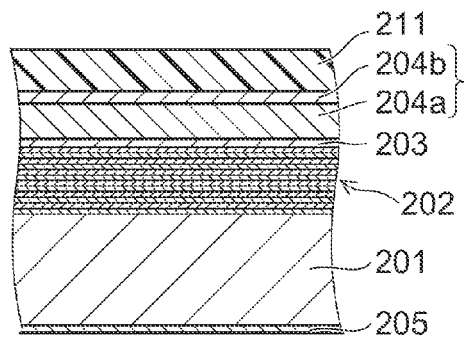
FIGS. 2A to 2H are schematic process cross-sectional views for illustrating a method for manufacturing a reflective mask according to a first embodiment.
Figure 2E:
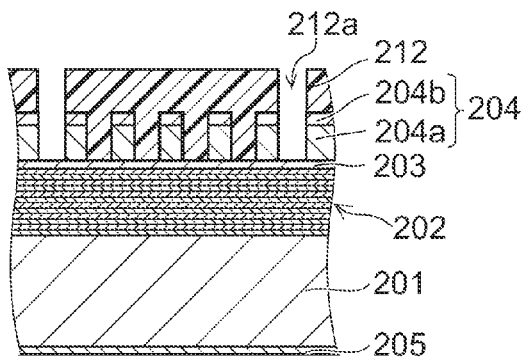
Figure 2B:
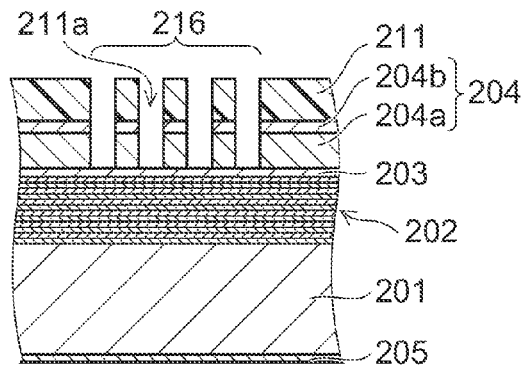
Figure 2F:
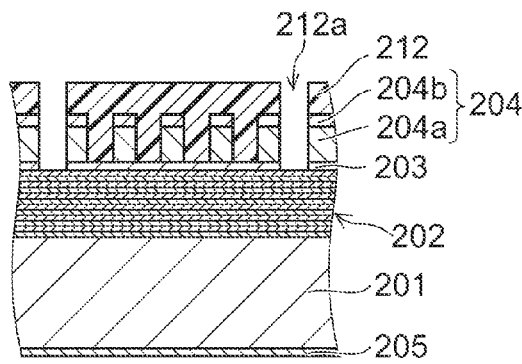
Figure 2C:
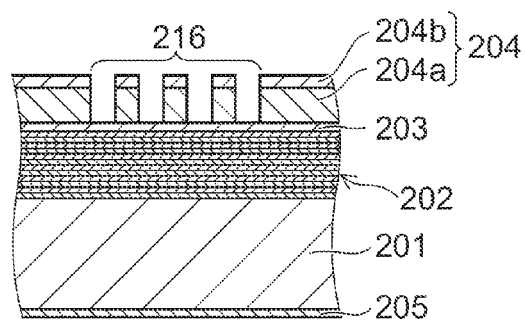

FIGS. 2A to 2H are schematic process cross-sectional views for illustrating a method for manufacturing a reflective mask according to a first embodiment. FIGS. 2A to 2C are schematic process cross-sectional views for illustrating the formation of a pattern region, and FIGS. 2D to 2H are schematic process cross-sectional views for illustrating the formation of a light blocking region.

(Formation of the Pattern Region)

First, the formation of a pattern region 216 is illustrated.

As shown in FIG. 2A, an EB resist (a resist for electron beam direct drawing) 211 is applied to the surface of the anti-reflection layer 204b. Then, an electron beam lithography system is used to draw a desired pattern (e.g., a circuit pattern etc.), and post exposure bake (PEB), development, etc. are performed; thereby, a desired resist pattern is formed.

Next, as shown in FIG. 2B, the anti-reflection layer 204b and the absorber layer 204a are sequentially etching-processed.

Here, the absorber layer 204a and the anti-reflection layer 204b may be sequentially etching-processed in the same processing environment (e.g., in the same processing chamber).

However, there is a concern that by-products generated in the etching processing of one layer may remain in the processing environment, the remaining by-products may be decomposed to generate reaction products in the etching processing of another layer, and the reaction products may reduce the dimensional controllability and the stability of etching processing in the etching processing of the other layer.

If the dimensional controllability in etching processing and the stability of etching processing are reduced, a defect portion may be generated in the reflective mask. In this case, the defect portion is transferred as is to a base (e.g., a wafer, a glass substrate, etc.) on which a pattern is formed, and this causes a large number of defective goods.

Figure 3:
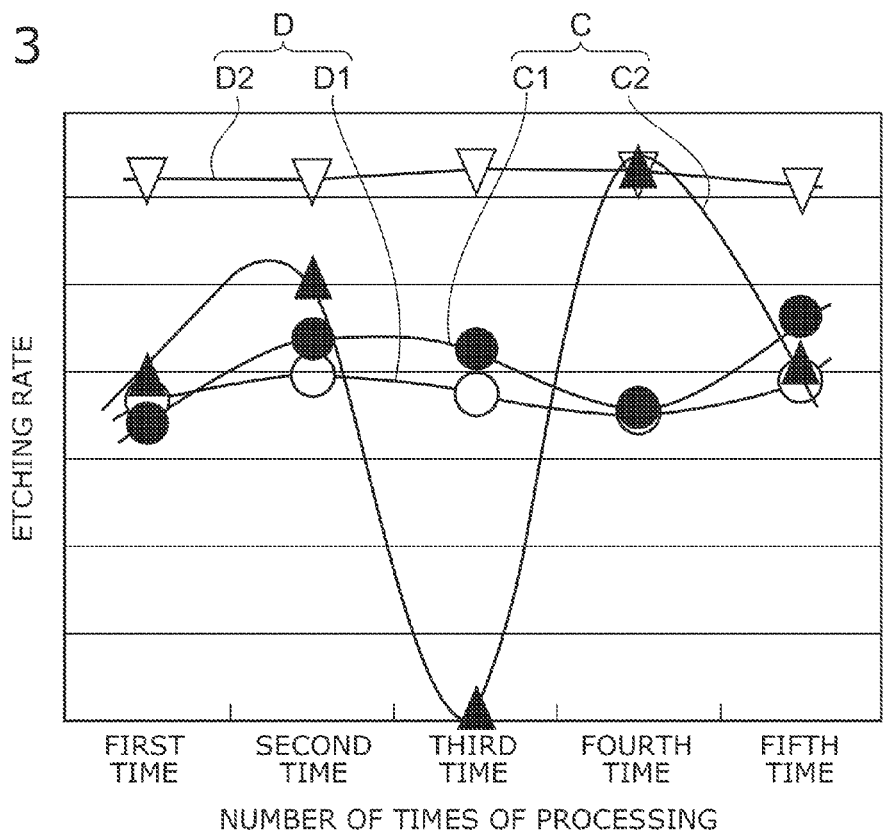
FIG. 3 is a schematic graph for illustrating a variation of the etching rate in etching processing.

FIG. 3 is a schematic graph for illustrating a variation of the etching rate in etching processing.

C in FIG. 3 is the case where etching processings are sequentially performed from the upper layer in the same processing environment. In this case, C1 is the case of etching processing the anti-reflection layer 204b formed of tantalum boron oxide (TaBO), and C2 is the case of etching processing the absorber layer 204a formed of tantalum boron nitride (TaBN).

D in FIG. 3 is the case where the absorber layer 204a and the anti-reflection layer 204b are etching-processed in different processing environments (e.g., in different processing chambers). In this case, D1 is the case of etching processing the anti-reflection layer 204b formed of tantalum boron oxide (TaBO), and D2 is the case of etching processing the absorber layer 204a formed of tantalum boron nitride (TaBN).

As shown in FIG. 3, the variation range of the etching rate in C2 is large. Here, in the case of etching processing the anti-reflection layer 204b formed of tantalum boron oxide (TaBO), by-products are generated in a relatively large amount. Consequently, the by-products generated when the anti-reflection layer 204b is etching-processed remain in the processing environment, and when the absorber layer 204a is etching-processed, the remaining by-products are decomposed to generate reaction products, which leads to a large variation range of the etching rate in C2.

On the other hand, in the case of etching processing the absorber layer 204a, the amount of by-products generated is small. Consequently, when the anti-reflection layer 204b is etching-processed, also the influence of the by-products generated when the absorber layer 204a is etching-processed is small.

Furthermore, even if by-products are generated in a large amount when the anti-reflection layer 204b is etching-processed, the influence on the etching processing of the anti-reflection layer 204b which is next performed is small. That is, the components of the generated by-products are made of elements included in the matter used in the etching processing; therefore, even if the by-products are decomposed to generate reaction products in the etching processing next performed, the influence on the etching processing is small.

Consequently, the variation range of the etching rate in C1 is smaller than the variation range of the etching rate in C2.

However, if the variation range of the etching rate in C2 is large, the dimensional controllability and the stability of etching processing in performing etching processing are still low.

In contrast, in both cases of D1 and D2, the variation range of the etching rate can be reduced.

That is, if etching processing is performed while the absorber layer 204a and the anti-reflection layer 204b are placed in different processing environments, the dimensional controllability and the stability of etching processing in forming a pattern can be improved.

Hereinbelow, as an example, the case is illustrated where the absorber layer 204a and the anti-reflection layer 204b are etching-processed in different processing environments.

First, a first etching processing (the etching processing of the anti-reflection layer 204b) is performed.

In this case, etching processing using a fluorine-containing gas may be performed. As the fluorine-containing gas, for example, $CF_4$, $CHF_3$, $NF_3$, and the like and a mixed gas thereof may be illustrated.

In this etching processing, plasma P generated excites and activates the fluorine-containing gas to generate reaction products such as neutral active species, ions, and electrons. The generated reaction products are supplied to the anti-reflection layer 204b formed of tantalum boron oxide (TaBO) via openings 211a of the EB resist 211; thereby, etching processing is performed. The first etching processing is performed until the surface of the absorber layer 204a becomes exposed. That is, the anti-reflection layer 204b formed in the mask blank 200 (an object to be processed) is etching-processed so as to have a prescribed configuration.

Next, the mask blank 200 that has undergone the first etching processing is transferred to the environment (a second environment) for performing a second etching processing which is separated from the environment (a first environment) for performing the first etching processing.

In this case, in order that the by-products generated in the first etching processing may not be mixed into the environment for performing the second etching processing, the environment for performing the first etching processing and the environment for performing the second etching processing are separated.

In the transfer from the environment for performing the first etching processing to the environment for performing the second etching processing, if the exposed surface of the absorber layer 204a formed of tantalum boron nitride (TaBN) is exposed to oxygen, the surface of the absorber layer 204a may be oxidized to prevent stable etching processing. Therefore, in the transfer from the environment for performing the first etching processing to the environment for performing the second etching processing, the transfer is preferably performed via an environment with a lower oxygen concentration than the atmosphere (e.g., a reduced-pressure environment, an environment purged with an inert gas or the like, etc.).

Next, the second etching processing (the etching processing of the absorber layer 204a) is performed.

In this case, etching processing using a chlorine-containing gas may be performed. As the chlorine-containing gas, for example, $Cl_2$, $CCl_4$, HCl, and the like and a mixed gas thereof may be illustrated.

In this etching processing, plasma P generated excites and activates the chlorine-containing gas to generate reaction products such as neutral active species, ions, and electrons. The generated reaction products are supplied to the absorber layer 204a formed of tantalum boron nitride (TaBN) via openings 211a of the EB resist 211 and the portions that have undergone the first etching processing; thereby, etching processing is performed. The second etching processing is performed until the surface of the capping layer 203 becomes exposed.

That is, the absorber layer 204a formed under the anti-reflection layer 204b is etching-processed so as to have a prescribed configuration.

Next, as shown in FIG. 2C, the EB resist 211 is removed.

In this case, dry ashing processing using an oxygen-containing gas may be performed, or we ashing processing using a chemical liquid may be performed.

After the EB resist 211 is removed, a defect inspection, the remedy of defect portions, etc. may be performed as necessary.

Thus, the pattern region 216 is formed.

(Formation of the Light Blocking Region)

Next, the formation of a light blocking region 217 is illustrated.

The light blocking region 217 is a frame-like region formed so as to surround the pattern region 216, and is formed in order to prevent exposure light from coming out to an adjacent region when the pattern is transferred.

Figure 2G:
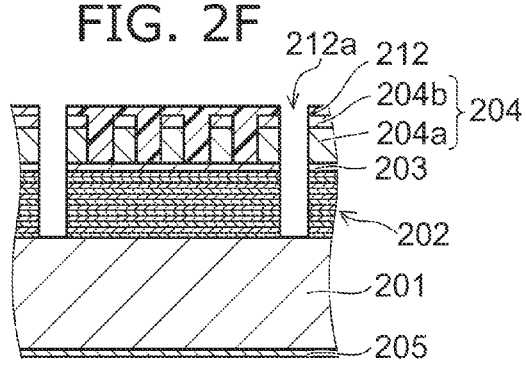
Figure 2D:
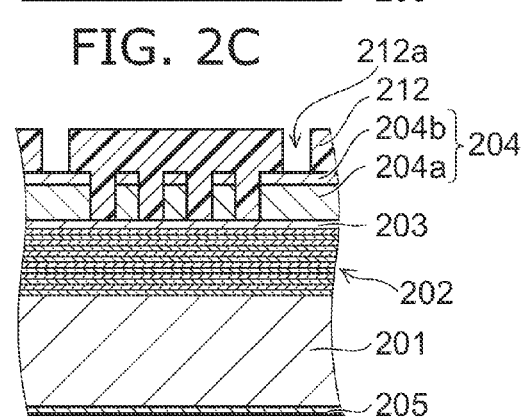

First, as shown in FIG. 2D, a resist 212 is applied to the anti-reflection layer 204b, the absorber layer 204a and the exposed surface of the capping layer 203. Then, laser light or the like is used to draw a desired pattern, and post exposure bake, development, etc. are performed; thereby, a desired resist pattern is formed. In this case, a frame-like region 212a is patterned so as to surround the pattern region 216.

Here, performing etching processing removes also the resist 212. Therefore, there is a case where the re-formation of the resist pattern that is an etching mask is needed.

In this case, if the application of the resist 212, the drawing of the pattern, post exposure bake, development, etc. are repeatedly performed, productivity is significantly reduced.

When the reflection layer 202 is etching-processed, the difference between the etching rate to the molybdenum (Mo) layer and the etching rate to the silicon (Si) layer is preferably made small. If the difference between the etching rate to the molybdenum (Mo) layer and the etching rate to the silicon (Si) layer is large, the etching amount of the layer of the larger etching rate is large, and therefore the etching-processed surface may become in a comb teeth shape. If the etching-processed surface is in a comb teeth shape, the quality of the reflective mask may be reduced, and breakage or the like may occur to generate particles.

Figure 4:
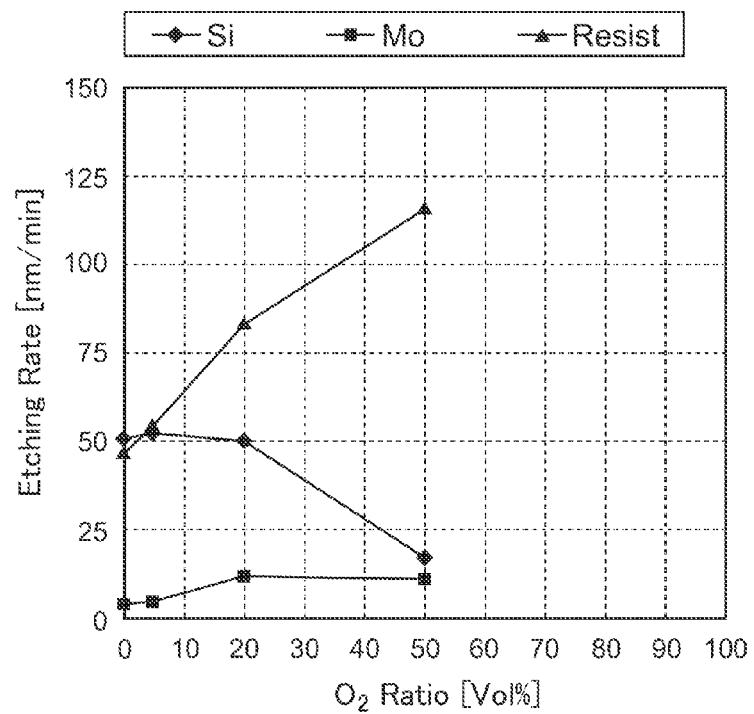
FIG. 4 is a graph for illustrating the etching rate in the case where a gas containing fluorine and oxygen is used.

FIG. 4 is a graph for illustrating the etching rate in the case where a gas containing fluorine and oxygen is used.

FIG. 4 is a graph for illustrating the change in the etching rate to molybdenum (Mo), silicon (Si), and the resist in the case where $CF_4$ is used as a fluorine-based gas and the additive amount of oxygen ($O_2$) is changed.

As shown in FIG. 4, when etching processing is performed using only the fluorine-based gas, the difference between the etching rate to molybdenum (Mo) and the etching rate to silicon (Si) is excessively large.

In this case, if the additive amount of oxygen is increased, the difference between the etching rate to molybdenum (Mo) and the etching rate to silicon (Si) can be reduced. For example, if the additive amount of oxygen is set to 50 vol %, the etching rate to molybdenum (Mo) and the etching rate to silicon (Si) can be made almost equal.

However, when the additive amount of oxygen is increased, the etching rate to the resist increases, and the re-formation of the resist pattern described above is needed.

The inventors have conducted studies and found out that the etching rates to molybdenum (Mo), silicon (Si), and the resist can be made appropriate by using a gas containing chlorine and oxygen and controlling the additive amount of oxygen.

Figure 5:
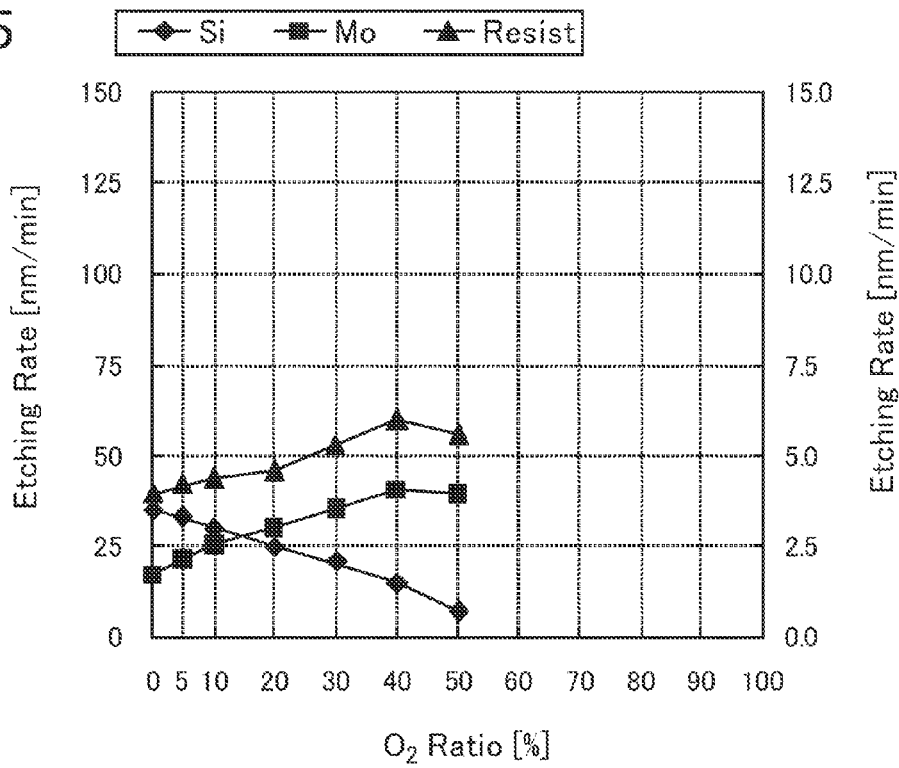
FIG. 5 is a graph for illustrating the etching rate in the case where a gas containing chlorine and oxygen is used.

FIG. 5 is a graph for illustrating the etching rate in the case where a gas containing chlorine and oxygen is used.

FIG. 5 is a graph for illustrating the change in the etching rate to molybdenum (Mo), silicon (Si), and the resist in the case where, as an example, $Cl_2$ is used as a chlorine-based gas and the additive amount of oxygen ($O_2$) is changed.

As shown in FIG. 5, when the additive amount of oxygen is set not less than 5 vol % and not more than 30 vol %, the difference between the etching rate to molybdenum (Mo) and the etching rate to silicon (Si) can be reduced to a level that can suppress the etching-processed surface becoming in a comb teeth shape.

Furthermore, when the additive amount of oxygen is set not less than 5 vol % and not more than 30 vol %, the etching-processed surface becoming in a comb teeth shape can be suppressed, and at least the number of times of re-formation of the resist pattern can be reduced.

In this case, if the thickness of the resist is set in view of the etching rates to molybdenum (Mo), silicon (Si), and the resist, the light blocking region 217 can be formed without performing the re-formation of the resist pattern.

Next, referring to FIG. 2E again, the formation of the light blocking region 217 is further illustrated.

As shown in FIG. 2E, the anti-reflection layer 204b and the absorber layer 204a are sequentially etching-processed. The etching processing is performed until the surface of the capping layer 203 becomes exposed.

The etching processing of the anti-reflection layer 204b and the absorber layer 204a may be similar to that illustrated in FIG. 2B.

It is also possible to etching-process the absorber layer 204a and the anti-reflection layer 204b in the light blocking region 217 simultaneously in the formation of the pattern region 216.

Next, as shown in FIG. 2F, the capping layer 203 is etching-processed.

Here, in the case where the capping layer 203 is formed of silicon (Si), etching processing using a chlorine-containing gas may be performed. In the case where a film of silicon oxide is formed at the surface of the capping layer 203, removing the film of silicon oxide is difficult if an oxygen-containing gas is used. Therefore, in such a case, etching processing using a chlorine-containing gas may be performed. As the chlorine-containing gas, for example, $Cl_2$, $CCl_4$, HCl, and the like may be illustrated.

Alternatively, it is also possible to remove the film of silicon oxide formed at the surface of the capping layer 203 by performing etching processing using a fluorine-containing gas.

Next, as shown in FIG. 2G, the reflection layer 202 including a molybdenum (Mo) layer and a silicon (Si) layer is etching-processed.

In this case, a gas containing chlorine and oxygen is used, and the additive amount of oxygen is set not less than 5 vol % and not more than 30 vol %. Such additive amounts of oxygen can suppress the etching-processed surface becoming in a comb teeth shape.

As the chlorine-containing gas, for example, $Cl_2$, $CCl_4$, HCl, and the like may be illustrated.

Furthermore, for example, when the total thickness of the absorber layer 204 is approximately 70 nm, the thickness of the capping layer 203 is approximately 10 nm, and the total thickness of the reflection layer 202 is approximately 280 nm, by setting the thickness of the resist to 420 nm or more and setting the additive amount of oxygen not less than 5 vol % and not more than 30 vol %, at least the number of times of re-formation of the resist pattern can be greatly reduced.

Here, the silicon (Si) layer in the reflection layer 202 may convert to silicon oxide ($SiO_2$) layer by oxidation in film formation or by oxidation by oxygen in the etching gas.

Use of the gas containing chlorine and oxygen has a gas condition in which selectivity to the silicon oxide ($SiO_2$) layer increases. Therefore, the etching rate of the silicon oxide ($SiO_2$) layer is extremely lowered, and the silicon oxide ($SiO_2$) layer may remain as a residue.

In the case like this, further adding a gas containing chlorine (for example, $CF_4$, $CHF_3$, $NF_3$ and a mixed gas of these gases) to the gas containing chlorine and oxygen can increase the etching rate of the silicon oxide ($SiO_2$) layer.

In the case of adding the gas containing fluorine, adjusting the additive amount to the gas containing chlorine can remove molybdenum (Mo) and silicon (Si) with the generally same etching rate.

Figure 6:
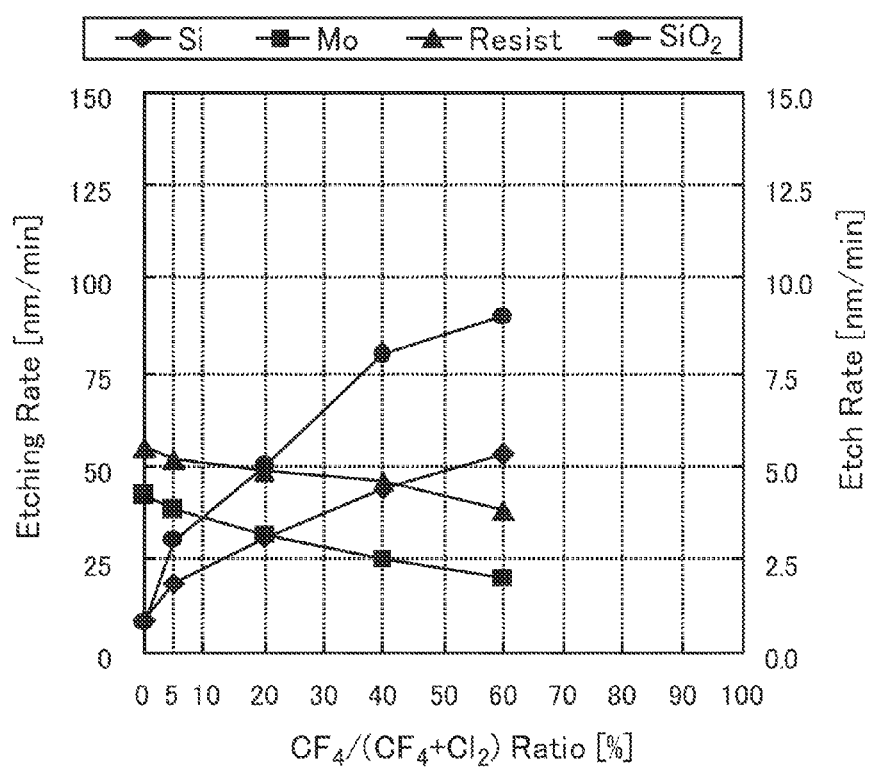
FIG. 6 is a graph for illustrating the etching rate in the case where a gas containing fluorine is added to the gas containing chlorine and oxygen.

FIG. 6 is a graph for illustrating the etching rate in the case where a gas containing fluorine is added to the gas containing chlorine and oxygen.

Figure 7:
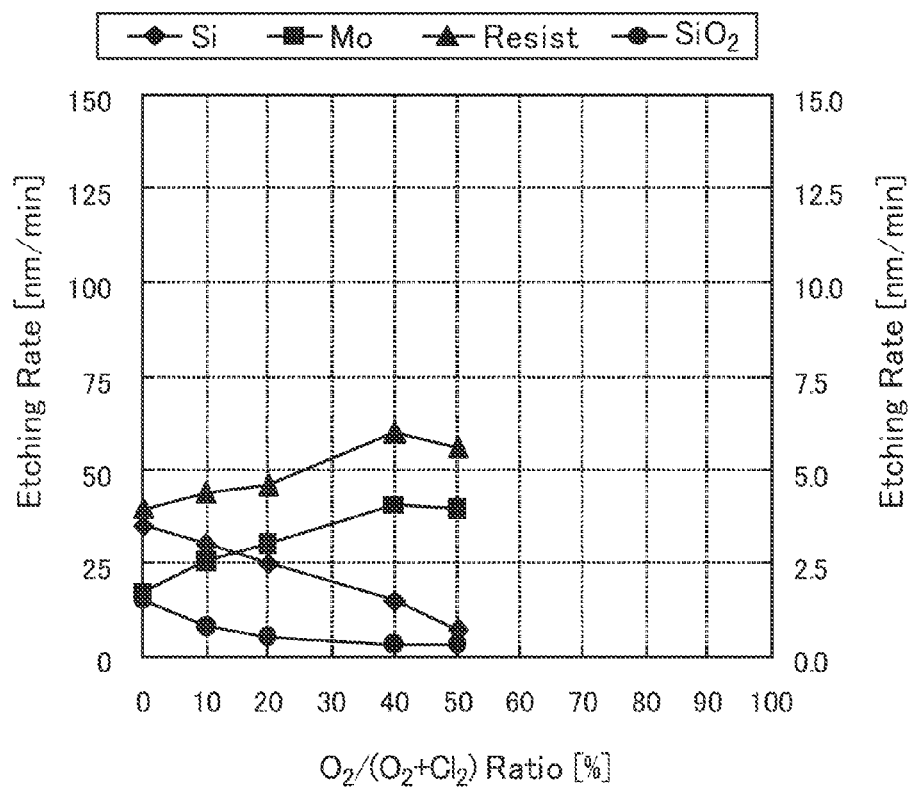
FIG. 7 is a graph for illustrating the etching rate in the case of the gas containing chlorine and oxygen.

FIG. 7 is a graph for illustrating the etching rate in the case of the gas containing chlorine and oxygen.

As can be seen from FIG. 6, if the additive amount of CF4 being the gas containing fluorine to chlorine is 5 vol % or more and 40 vol % or less, while maintaining the selectivity to the resist, molybdenum (Mo) and silicon (Si) can be removed with the generally same etching rate.

In FIG. 6, a ratio of the gas containing oxygen to total gas (gas containing chlorine and oxygen) is approximately 20 vol %.

Furthermore, compared with the case of etching processing using the gas containing chlorine and oxygen shown in FIG. 7, the etching rate of the silicon oxide ($SiO_2$) layer can be nearly ten times higher. Therefore, the etching processing not remaining the silicon oxide ($SiO_2$) layer as the residue can be performed.

Similarly to the case of the formation of the pattern region 216, the layers may be etching-processed in different processing environments.

In this case, the absorber layer 204a in the light blocking region 217 may be etching-processed in the processing environment in which the absorber layer 204a in the pattern region 216 has been etching-processed. The anti-reflection layer 204b or the capping layer 203 in the light blocking region 217 may be etching-processed in the processing environment in which the anti-reflection layer 204b in the pattern region 216 has been etching-processed.

The reflection layer 202 may be etching-processed in a processing environment different from them.

In the case where the capping layer 203 is formed of silicon (Si), the capping layer 203 may be etching-processed in the environment for etching-processing the reflection layer 202.

Thereby, the dimensional controllability and processing stability in forming the light blocking region 217 can be improved.

Figure 2H:
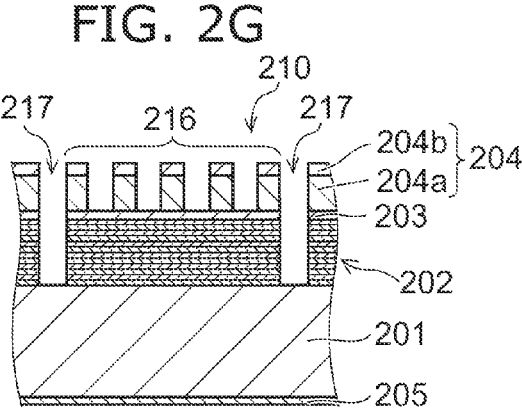

Next, as shown in FIG. 2H, the resist 212 is removed.

In this case, dry ashing processing using an oxygen-containing gas may be performed, or we ashing processing using a chemical liquid may be performed.

In this case, in the case where the capping layer 203 is formed of ruthenium (Ru), performing dry ashing processing using an oxygen-containing gas may cause damage to the capping layer 203. Therefore, in the case where the capping layer 203 is formed of ruthenium (Ru), dry ashing processing using a gas containing no oxygen is preferably performed.

By thus forming the light blocking region 217, the reflective mask 210 is manufactured.

Second Embodiment

Figure 8:
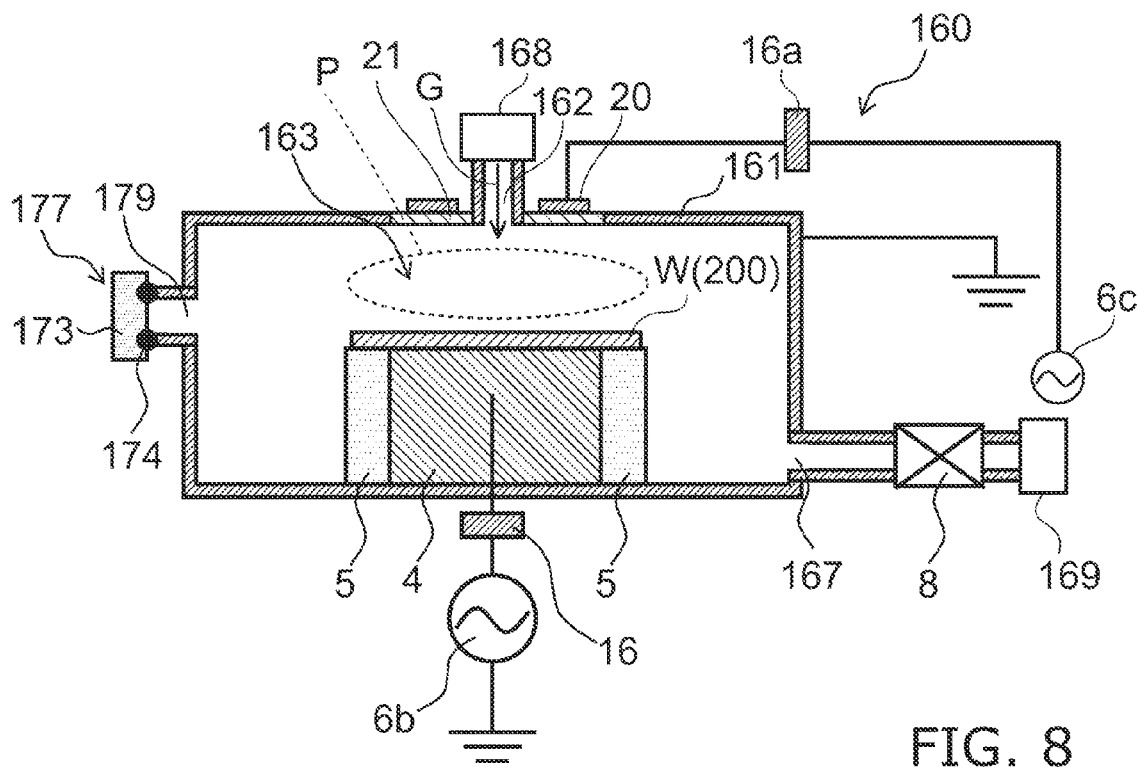
FIG. 8 is a schematic cross-sectional view for illustrating an apparatus for manufacturing a reflective mask according to a second embodiment.

FIG. 8 is a schematic cross-sectional view for illustrating an apparatus for manufacturing a reflective mask according to a second embodiment.

The apparatus for manufacturing a reflective mask illustrated in FIG. 8 is a two-frequency plasma etching apparatus. As shown in FIG. 8, a manufacturing apparatus 160 includes a processing chamber 161 (corresponding to an example of a fourth processing chamber), a gate valve 177 that closes a carry-in/out port 179 provided at the processing chamber 161, a gas supply unit 168 (corresponding to an example of a fourth supply unit) that selectively supplies a plurality of processing gases G into the processing chamber 161, an exhaust unit 169 (corresponding to an example of a fourth exhaust unit) that exhausts the interior of the processing chamber 161, etc.

The processing chamber 161 is formed of an electrically conductive material such as aluminum, and can maintain a reduced-pressure atmosphere. A processing gas introduction port 162 for introducing the processing gas G is provided in a central portion of the ceiling of the processing chamber 161.

The processing gas G is supplied from the gas supply unit 168 into the processing chamber 161 via the processing gas introduction port 162. When the processing gas G is supplied into the processing chamber 161, the flow rate, pressure, etc. of the processing gas G are adjusted by a not-shown processing gas adjustment unit.

A not-shown switching unit is provided in the gas supply unit 168 so that the type of the processing gas G supplied into the processing chamber 161 can be switched. For example, when the reflection layer 202, the capping layer 203, the absorber layer 204a, and the anti-reflection layer 204b described above are etching-processed, processing gases G suitable for the respective etching processings can be supplied.

A dielectric window 21 made of a dielectric material (e.g., quartz etc.) is provided in a portion of the ceiling of the processing chamber 161 on the outside of the diameter of the processing gas introduction port 162. A coil 20 made of an electric conductor is provided on the surface of the dielectric window 21. One end of the coil 20 is grounded (not shown), and the other end is connected to a high-frequency power source 6c via a matching box 16a.

A processing space 163 that is a space for etching-processing an object to be processed W is provided in the processing chamber 161. The object to be processed W may be, for example, the mask blank 200 described above.

An electrode unit 4 is provided below the processing space 163. A high-frequency power source 6b is connected to the electrode unit 4 via a matching box 16. The processing chamber 161 is grounded.

The manufacturing apparatus 160 is a two-frequency plasma etching apparatus that includes an inductively coupled electrode in an upper portion and a capacitively coupled electrode in a lower portion. That is, the electrode unit 4 and the processing chamber 161 constitute a capacitively coupled electrode, and the coil 20 forms an inductively coupled electrode.

The high-frequency power source 6b may be one that applies a high-frequency electric power of approximately 1 KW having a frequency of approximately 100 KHz to 100 MHz to the electrode unit 4.

The high-frequency power source 6c may be one that applies a high-frequency electric power of approximately 3 KW having a frequency of approximately 100 KHz to 100 MHz to the coil 20.

A not-shown tuning circuit is provided in the matching boxes 16 and 16a. Plasma P can be controlled by controlling reflected waves with the not-shown tuning circuits.

In the manufacturing apparatus 160, the electrode unit 4, the processing chamber 161, the high-frequency power source 6b, the high-frequency power source 6c, the coil 20, etc. constitute a plasma generation unit (corresponding to an example of a fourth plasma generation unit) that generates plasma P in the processing chamber 161.

The periphery of the electrode unit 4 is covered with an insulating ring 5. The object to be processed W can be mounted on the electrode unit 4 in which a holding mechanism (not shown) for holding the object to be processed W, a delivery unit (not shown) for delivering the object to be processed W, etc. are provided.

An exhaust port 167 is provided at the bottom of the processing chamber 161, and an exhaust unit 169 such as a vacuum pump and the like is connected to the exhaust port 167 via a pressure controller 8. The exhaust unit 169 performs exhaust so that the interior of the processing chamber 161 may become at a prescribed pressure. The side wall of the processing chamber 161 is provided with a carry-in/out port 179 for carrying in and out the object to be processed W, and provided with a gate valve 177 so that the carry-in/out port 179 can be closed in a gas-tight manner. The gate valve 177 includes a door 173 provided with a seal member 174 such as an O ring, and is opened and closed by a not-shown gate opening/closing mechanism. When the door 173 is closed, the seal member 174 is pressed against the wall surface of the carry-in/out port 179, and the carry-in/out port 179 is closed in a gas-tight manner.

A partition unit 12 and a raising/lowering unit 11 described later may be further provided.

(Working of the Apparatus for Manufacturing a Reflective Mask 160)

Next, the working of the manufacturing apparatus 160 is illustrated.

In this case, as an example, a description is given using the case where the object to be processed W is the mask blank 200 and etching processing is performed on the mask blank 200 to manufacture the reflective mask 210. Furthermore, as an example, the case is illustrated where the substrate 201 is formed of a low thermal expansion material (LTEM), the reflection layer 202 includes a molybdenum (Mo) layer and a silicon (Si) layer, the capping layer 203 is formed of silicon (Si), the absorber layer 204a is formed of tantalum boron nitride (TaBN), and the anti-reflection layer 204b is formed of tantalum boron oxide (TaBO).

First, the formation of the pattern region 216 described above is performed.

The door 173 of the gate valve 177 is opened by the not-shown gate opening/closing mechanism.

The mask blank 200 is carried into the processing chamber through the carry-in/out port 179 by a not-shown carrying unit. The mask blank 200 is mounted on the electrode unit 4, and held by the not-shown holding mechanism provided in the electrode unit 4.

The not-shown carrying unit is moved to the outside of the processing chamber 161.

The door 173 of the gate valve 177 is closed by the not-shown gate opening/closing mechanism.

The interior of the processing chamber 161 is exhausted by the exhaust unit 169.

Then, the etching processing of the anti-reflection layer 204b described above is performed.

In this case, etching processing using a fluorine-containing gas may be performed.

More specifically, first, a fluorine-containing gas is supplied from the gas supply unit 168 into the processing space 163 via the processing gas introduction port 162. The fluorine-containing gas may be, for example, $CF_4$, $CHF_3$, $NF_3$, or the like or a mixed gas thereof. The flow rate of the fluorine-containing gas may be set to approximately 60 sccm.

Next, a high-frequency electric power having a frequency of approximately 100 KHz to 100 MHz is applied to the coil 20 by the high-frequency power source 6c. Furthermore, a high-frequency electric power having a frequency of approximately 100 KHz to 100 MHz is applied to the electrode unit 4 by the high-frequency power source 6b. The frequencies of the high-frequency electric powers applied by the high-frequency power source 6c and the high-frequency power source 6b are preferably set equal. For example, the frequencies of the high-frequency electric powers applied by the high-frequency power source 6c and the high-frequency power source 6b may be set to 13.56 MHz.

The high-frequency power source 6c may apply a high-frequency electric power of approximately 3 KW, and the high-frequency power source 6b may apply a high-frequency electric power of approximately 1 KW.

Thereby, since the electrode unit 4 and the processing chamber 161 constitute a capacitively coupled electrode, a discharge occurs between the electrode unit 4 and the processing chamber 161. Furthermore, since the coil 20 forms an inductively coupled electrode, a high-frequency electric power is introduced into the processing chamber 161 from the coil 20 via the dielectric window 21. Consequently, plasma P is generated in the processing space 163 by the discharge generated between the electrode unit 4 and the processing chamber 161 and the high-frequency electric power introduced into the processing chamber 161. The generated plasma P excites and activates the fluorine-containing gas to generate reaction products such as neutral active species, ions, and electrons. The generated reaction products go down in the processing space 163 to reach the mask blank 200; thereby, etching processing is performed. The control of the plasma P is carried out by controlling reflected waves with the not-shown tuning circuits provided in the matching boxes 16 and 16a.

The residual fluorine-containing gas and most of the reaction products and by-products are discharged to the outside of the processing chamber 161 through the exhaust port 167.

In this etching processing, part of the anti-reflection layer 204b is removed based on the resist pattern formed on the surface of the anti-reflection layer 204b. More specifically, portions of the anti-reflection layer 204b not covered with the EB resist 211 are removed.

After the etching processing of the anti-reflection layer 204b is finished, the interior of the processing chamber 161 is exhausted. Subsequently, etching processing is performed on the absorber layer 204a.

In this case, the type of the processing gas G supplied is switched by the not-shown switching unit provided in the gas supply unit 168. That is, a chlorine-containing gas is supplied from the gas supply unit 168, and etching processing using the chlorine-containing gas is performed. As the chlorine-containing gas, for example, $Cl_2$, $CCl_4$, HCl, or the like or a mixed gas thereof may be used. The flow rate of the chlorine-containing gas may be set to approximately 180 sccm.

Then, similarly to the case of the anti-reflection layer 204b, part of the absorber layer 204a is removed based on the resist pattern formed on the surface of the anti-reflection layer 204b. More specifically, portions of the absorber layer 204a not covered with the EB resist 211 are removed.

Thus, the formation of the pattern region 216 is performed.

After the formation of the pattern region 216 is finished, a purge gas or the like is introduced through the processing gas introduction port 162 so that the pressure in the processing chamber 161 and the pressure outside the door 173 of the gate valve 177 may be almost equal.

Then, the door 173 of the gate valve 177 is opened by the not-shown gate opening/closing mechanism.

The mask blank 200 with the pattern region 216 formed is carried out by the not-shown carrying unit.

In regard to the mask blank 200 carried out of the processing chamber 161, the residual EB resist 211 is removed, and a defect inspection, the remedy of defect portions, etc. are performed as necessary.

Next, the formation of the light blocking region 217 described above is performed.

First, outside the processing chamber 161, the resist 212 is applied to the anti-reflection layer 204b, the absorber layer 204a and the exposed surface of the capping layer 203, and the drawing of a pattern, post exposure bake, development, etc. are performed; thereby, a desired resist pattern is formed.

Next, similarly to what is described above, the mask blank 200 is carried into the processing chamber.

Then, similarly to what is described above, the anti-reflection layer 204b, the absorber layer 204a, the capping layer 203, and the reflection layer 202 are sequentially etching-processed.

In this case, as described above, in the etching processing of the reflection layer 202, a gas containing chlorine and oxygen may be used and the additive amount of oxygen may be set not less than 5 vol % and not more than 30 vol %. Such additive amounts of oxygen can suppress the etching-processed surface becoming in a comb teeth shape.

Furthermore, for example, when the total thickness of the absorber layer 204 is approximately 70 nm, the thickness of the capping layer 203 is approximately 10 nm, the total thickness of the reflection layer 202 is approximately 280 nm, and the thickness of the resist is 420 nm or more, the additive amount of oxygen may be set not less than 5 vol % and not more than 30 vol %. Such additive amounts of oxygen can at least greatly reduce the number of times of re-formation of the resist pattern.

As described previously, in the case where in the reflection layer 202, the silicon (Si) layer is oxidized and the silicon oxide (SiO$_2$) layer is formed, the gas containing fluorine (for example, CF$_4$, CHF$_3$, NF$_3$ or the like and a mixed gas of these gases) can be further added to the gas containing chlorine and oxygen.

In this case, the additive amount of CF$_4$ being the gas containing fluorine to chlorine can be 5 vol % or more and 40 vol % or less.

Then, while maintaining the selectivity to the resist, molybdenum (Mo) and silicon (Si) can be removed with the generally same etching rate.

Furthermore, compared with the case of etching processing using the gas containing chlorine and aoxygen, the etching rate of the silicon oxide (SiO$_2$) layer can be nearly ten tikes higher. the etching processing not remaining the silicon oxide (SiO$_2$) layer as the residue can be performed.

Working in regard to carrying in and out, working in regard to generating plasma, etc. are similar to those in the case of forming the pattern region 216, and a detailed description is therefore omitted.

Third Embodiment

Figure 9:
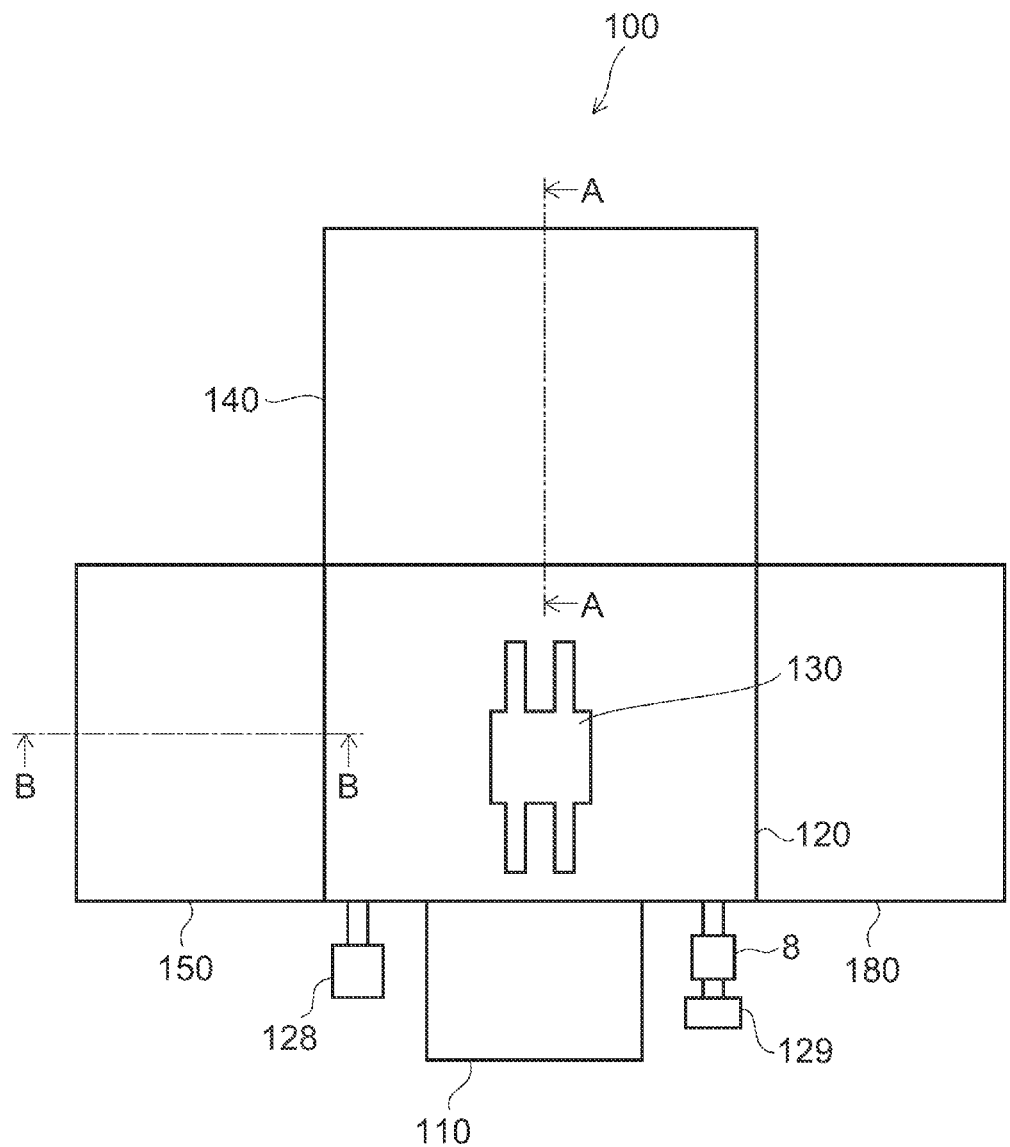
FIG. 9 is a schematic layout for illustrating an apparatus for manufacturing a reflective mask according to a third embodiment.

FIG. 9 is a schematic layout for illustrating an apparatus for manufacturing a reflective mask according to a third embodiment.

As shown in FIG. 9, an apparatus for manufacturing a reflective mask 100 includes a load lock unit 110, a transfer unit 120, a carrying unit 130, a first processing unit 140, a second processing unit 150, and a third processing unit 180.

Carry-in/out ports are formed at the wall surfaces between the load lock unit 110 and the transfer unit 120, between the transfer unit 120 and the first processing unit 140, between the transfer unit 120 and the second processing unit 150, and between the transfer unit 120 and the third processing unit 180. Connections are made between the load lock unit 110 and the transfer unit 120, between the transfer unit 120 and the first processing unit 140, between the transfer unit 120 and the second processing unit 150, and between the transfer unit 120 and the third processing unit 180 via the respective carry-in/out ports so as to connect the inner spaces thereof. The load lock unit 110, the transfer unit 120, the first processing unit 140, the second processing unit 150, and the third processing unit 180 are configured to be gas-tight so that a reduced-pressure atmosphere can be maintained.

A transfer exhaust unit 129 such as a vacuum pump and the like is connected to the transfer unit 120 via a pressure controller 8.

The transfer exhaust unit 129 performs exhaust so that the interior of the transfer unit 120 may become at a prescribed pressure.

When the object to be processed W (e.g., the mask blank 200) exists in the transfer unit 120, the transfer exhaust unit 129 exhausts the interior of the transfer unit 120 to make the oxygen concentration in the transfer unit 120 lower than the oxygen concentration of the atmosphere.

It is also possible to provide an inert gas supply unit 128 that supplies an inert gas so that an inert gas may be supplied from the inert gas supply unit 128 into the transfer unit 120. By purging the interior of the transfer unit 120 with an inert gas or the like, the oxygen concentration in the transfer unit 120 can be made lower than the oxygen concentration of the atmosphere.

When the object to be processed W (e.g., the mask blank 200) exists in the transfer unit 120, the inert gas supply unit 128 purges the interior of the transfer unit 120 with an inert gas to make the oxygen concentration in the transfer unit 120 lower than the oxygen concentration of the atmosphere.

By making the oxygen concentration in the transfer unit 120 lower than the oxygen concentration of the atmosphere, the surface of the object to be processed W being oxidized can be suppressed. Therefore, the stability of etching processing can be improved.

A not-shown exhaust unit such as a vacuum pump and the like is connected to the load lock unit 110 via a not-shown pressure controller.

The load lock unit 110 is not necessarily needed, and may be appropriately provided as necessary.

Figure 10:
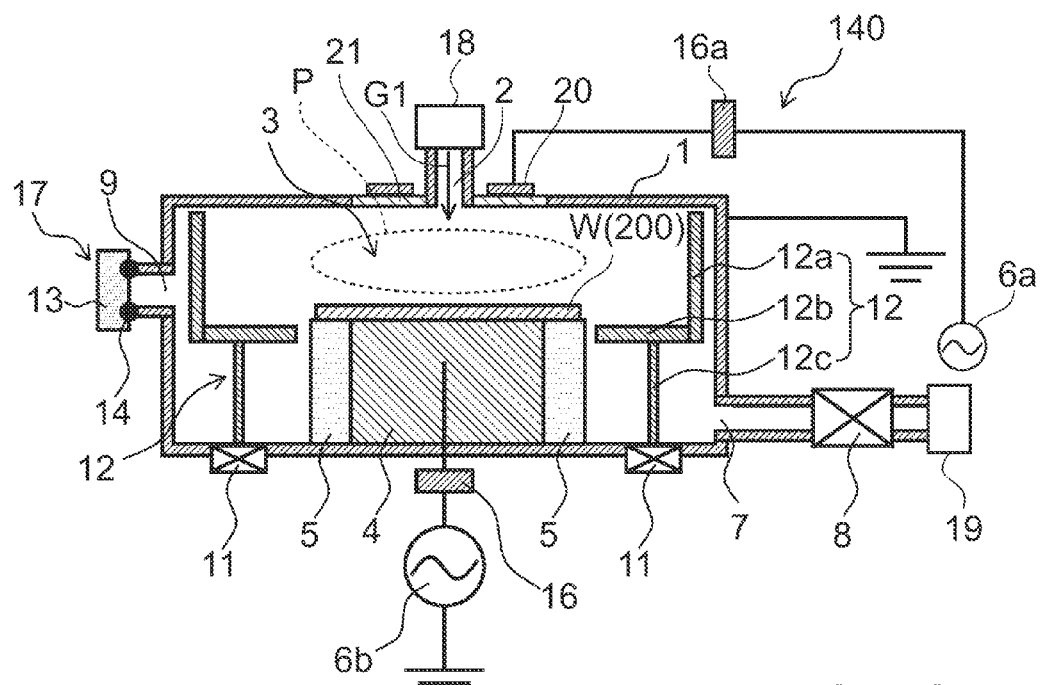
FIG. 10 is a schematic cross-sectional view for illustrating the first processing unit, and shows a state where a partition unit is raised.

A gate valve for closing each carry-in/out port in a gas-tight manner is provided (e.g., see FIG. 10 etc.).

The carrying unit 130 is provided in the transfer unit 120. The carrying unit 130 performs the delivery, carrying, and the like of the object to be processed W (e.g., the mask blank 200) between a not-shown carrying apparatus provided outside the apparatus for manufacturing a reflective mask 100, the first processing unit 140, the second processing unit 150, the third processing unit 180, and the like. The carrying unit 130 may be, for example, a robot apparatus that can grasp and carry the object to be processed W, and the like.

The configuration of the first processing unit 140, the second processing unit 150, and the third processing unit 180 may be altered in accordance with the material of the portion to be etching-processed. Although the case has been illustrated where three processing units are provided in the apparatus for manufacturing a reflective mask 100, the embodiment is not limited thereto. The number of processing units may be altered as appropriate.

In this case, a processing unit may be provided for each material of the portion to be etching-processed. For example, a processing unit used in the case where the portion to be etching-processed includes tantalum boron oxide (TaBO), a processing unit used in the case where the portion to be etching-processed includes tantalum boron nitride (TaBN), and a processing unit used in the case where the portion to be etching-processed includes a molybdenum (Mo) layer and a silicon (Si) layer may be provided.

Herein, as an example, the first processing unit 140 is used in the case where the portion to be etching-processed includes tantalum boron oxide (TaBO), the second processing unit 150 is used in the case where the portion to be etching-processed includes tantalum boron nitride (TaBN), and the third processing unit 180 is used in the case where the portion to be etching-processed includes a molybdenum (Mo) layer and a silicon (Si) layer.

Figure 11:
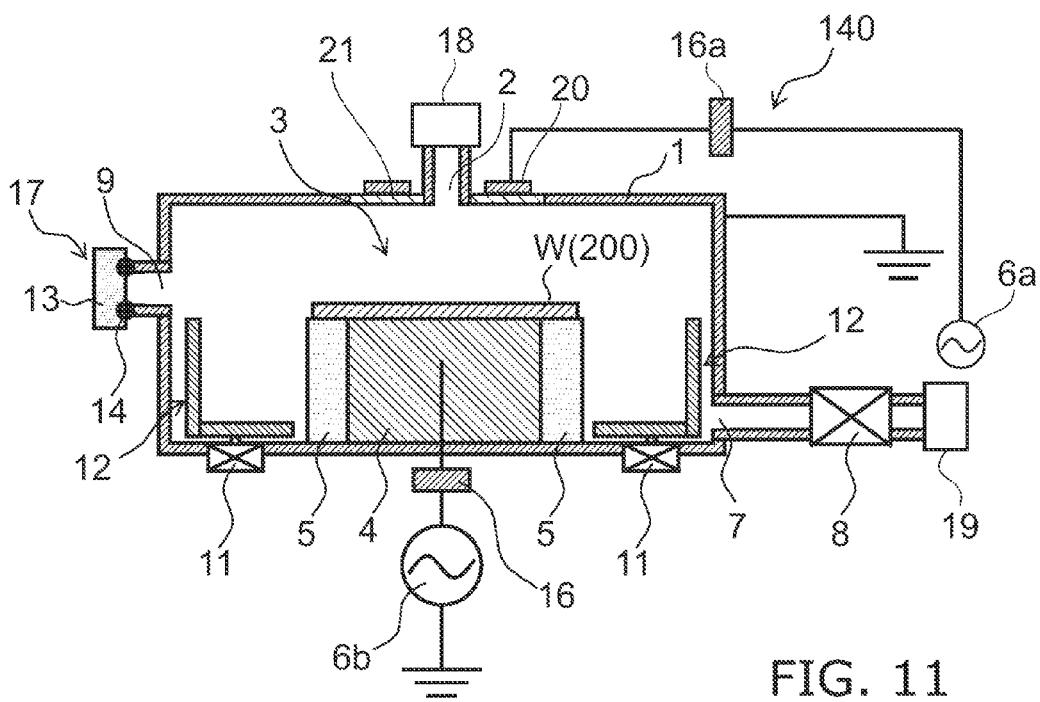
FIG. 11 is a schematic cross-sectional view for illustrating the first processing unit, and shows a state where the partition unit is lowered.

FIG. 10 and FIG. 11 are schematic cross-sectional views for illustrating the first processing unit. FIG. 10 and FIG. 11 are schematic cross-sectional views showing a cross section taken in the direction of arrows A-A in FIG. 9. FIG. 10 is a schematic cross-sectional view for illustrating a state where a partition unit is raised, and FIG. 11 is a schematic cross-sectional view for illustrating a state where the partition unit is lowered.

The first processing unit 140 includes a processing chamber 1 (corresponding to an example of a first processing chamber) formed of an electrically conductive material such as aluminum and capable of maintaining a reduced-pressure atmosphere. A processing gas introduction port 2 for introducing a processing gas G1 (corresponding to an example of a first gas) is provided in a central portion of the ceiling of the processing chamber 1. The processing gas G1 is supplied from a gas supply unit 18 (corresponding to an example of a first supply unit) into the processing chamber 1 via the processing gas introduction port 2. When the processing gas G1 is supplied into the processing chamber 1, the flow rate, pressure, etc. of the processing gas G1 are adjusted by a not-shown processing gas adjustment unit.

Here, in the case where a layer (e.g., the anti-reflection layer 204b) including tantalum boron oxide (TaBO) is etching-processed in the first processing unit 140, the processing gas G1 may be a fluorine-containing gas. For example, the processing gas G1 may be $CF_4$, $CHF_3$, $NF_3$, or the like or a mixed gas thereof. The flow rate of the processing gas G1 may be set to approximately 60 sccm.

A dielectric window 21 made of a dielectric material (e.g., quartz etc.) is provided in a portion of the ceiling of the processing chamber 1 on the outside of the diameter of the processing gas introduction port 2. A coil 20 made of an electric conductor is provided on the surface of the dielectric window 21. One end of the coil 20 is grounded (not shown), and the other end is connected to a high-frequency power source 6a via a matching box 16a.

A processing space 3 that is a space for etching-processing the object to be processed W is provided in the processing chamber 1. An electrode unit 4 is provided below the processing space 3. A high-frequency power source 6b is connected to the electrode unit 4 via a matching box 16. The processing chamber 1 is grounded. The first processing unit 140 is a two-frequency plasma etching apparatus that includes an inductively coupled electrode in an upper portion and a capacitively coupled electrode in a lower portion. That is, the electrode unit 4 and the processing chamber 1 constitute a capacitively coupled electrode, and the coil 20 forms an inductively coupled electrode.

The high-frequency power source 6a may be one that applies a high-frequency electric power of approximately 3 KW having a frequency of approximately 100 KHz to 100 MHz to the coil 20.

The high-frequency power source 6b may be one that applies a high-frequency electric power of approximately 1 KW having a frequency of approximately 100 KHz to 100 MHz to the electrode unit 4.

A not-shown tuning circuit is provided in the matching boxes 16 and 16a. Plasma P can be controlled by controlling reflected waves with the not-shown tuning circuits.

In the first processing unit 140, the electrode unit 4, the processing chamber 1, the high-frequency power source 6a, the high-frequency power source 6b, the coil 20, etc. constitute a plasma generation unit (corresponding to an example of a first plasma generation unit) that generates plasma P in the processing chamber 1.

The periphery of the electrode unit 4 is covered with an insulating ring 5. The object to be processed W can be mounted on the electrode unit 4 in which a holding mechanism (not shown) for holding the object to be processed W, a delivery unit (not shown) for delivering the object to be processed W, etc. are provided.

An exhaust port 7 is provided at the bottom of the processing chamber 1, and an exhaust unit 19 (corresponding to an example of a first exhaust unit) such as a vacuum pump and the like is connected to the exhaust port 7 via a pressure controller 8. The exhaust unit 19 performs exhaust so that the interior of the processing chamber 1 may become at a prescribed pressure. The side wall of the processing chamber 1 is provided with a carry-in/out port 9 (corresponding to an example of a first carry-in/out port) for carrying in and out the object to be processed W, and provided with a gate valve 17 (corresponding to an example of a first gate valve) so that the carry-in/out port 9 can be closed in a gas-tight manner. The gate valve 17 includes a door 13 provided with a seal member 14 such as an O ring, and is opened and closed by a not-shown gate opening/closing mechanism. When the door 13 is closed, the seal member 14 is pressed against the wall surface of the carry-in/out port 9, and the carry-in/out port 9 is closed in a gas-tight manner.

A partition unit 12 is provided on the outside of the electrode unit 4. In the first processing unit 140, a fluorine-containing gas is used to etching-process a layer including tantalum boron oxide (TaBO). In this case, when the layer including tantalum boron oxide (TaBO) is etching-processed, by-products are generated in a relatively large amount. In view of this, in the first processing unit 140, the partition unit 12 for partitioning the processing space 3 is provided when the layer including tantalum boron oxide (TaBO) formed in the object to be processed W is removed. That is, by providing the partition unit 12, the adhesion of by-products to the side wall, bottom, and the like of the processing chamber 1 outside the partition unit 12 can be suppressed. Although by-products adhere also to the inner wall and the like of the partition unit 12, it is possible to exchange the partition unit 12 or take out and clean the partition unit 12, and therefore maintenance time can be greatly reduced. Furthermore, by providing the partition unit 12, also the entry of particles and the like into the processing space 3 from the outside can be suppressed.

The partition unit 12 includes a side surface portion 12a, a bottom portion 12b, and a leg portion 12c. The side surface portion 12a is in a circular cylindrical shape, and is provided so as to be close to the inner wall of the processing chamber 1. The bottom portion 12b is in a disc shape, the end surface of the outer periphery is fixed near the lower end surface of the side surface portion 12a, and the end surface on the inner periphery side is close to the insulating ring 5. The shapes of the side surface portion 12a and the bottom portion 12b are not limited to those illustrated, but may be altered as appropriate. For example, the side surface portion 12a may be in a polygonal cylindrical shape, and the bottom portion 12b may be in a polygonal plate shape.

One end of the leg portion 12c is connected to the bottom portion 12b, and the other end is connected to a raising/lowering unit 11. The leg portion 12c is in a circular columnar shape, but is not limited thereto, and the cross section may be in a polygonal columnar shape, circular cylindrical shape, or the like. The power source of the raising/lowering unit 11 may be, for example, a motor, air cylinder, hydraulic cylinder, or the like, but is not limited thereto and may be a driving source having a similar function. The raising end position and the lowering end position of the partition unit 12 can be controlled by the signal from a not-shown detector, or can be controlled by time using a timer or the like.

At the raising end position (FIG. 10) of the partition unit 12, there is preferably a small gap between the upper end surface of the side surface portion 12a and the ceiling portion of the processing chamber 1. This is because, if the upper end surface of the side surface portion 12a and the ceiling portion of the processing chamber 1 are in contact, contaminants such as particles may be generated. At this time, the surface (the surface on the processing space 3 side) of the bottom portion 12b is at the same position as or at a lower position than the position of the surface of the electrode unit 4.

At the lowering end position (FIG. 11) of the partition unit 12, the position of the upper end surface of the side surface portion 12a is at the same position as or at a slightly lower position than the position of the surface of the electrode unit 4 in view of the carrying in and out of the object to be processed W, but is not limited thereto, and may be appropriately altered depending on the not-shown delivery unit for the object to be processed W. At this time, there is preferably a gap between the bottom portion 12b and the bottom of the processing chamber 1. This is because, if the bottom portion 12b and the bottom of the processing chamber 1 are in contact, contaminants such as particles may be generated.

Next, the second processing unit 150 is illustrated.

Figure 12:
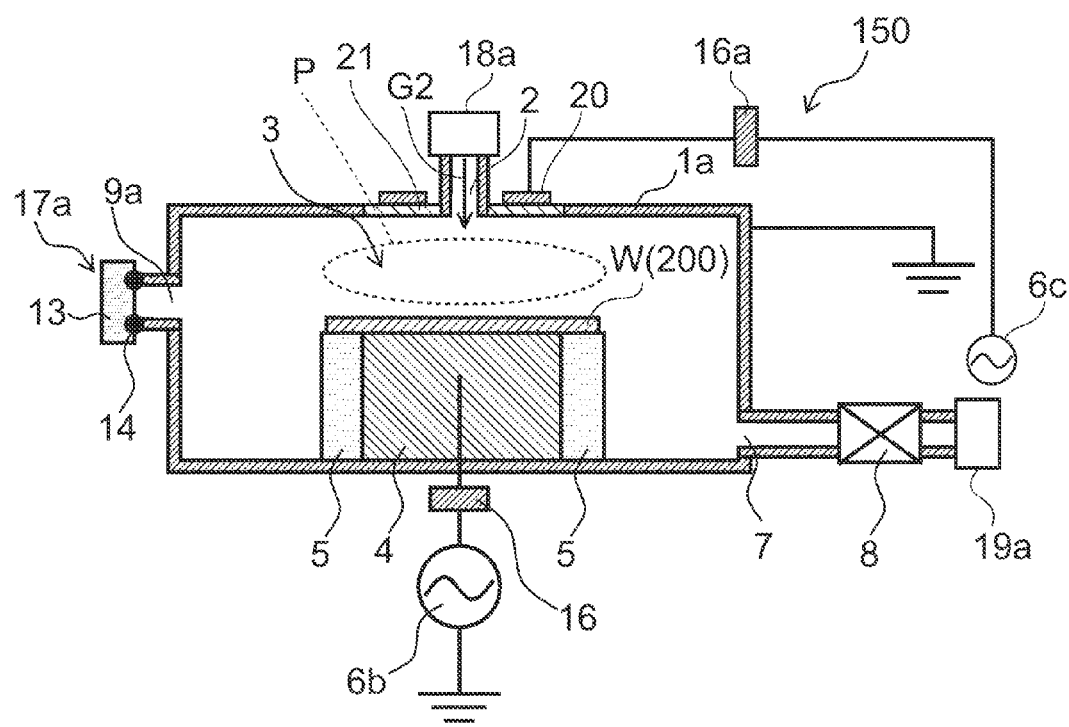
FIG. 12 is a schematic cross-sectional view for illustrating the second processing unit.

FIG. 12 is a schematic cross-sectional view for illustrating the second processing unit. FIG. 12 is a schematic cross-sectional view showing a cross section taken in the direction of arrows B-B in FIG. 9.

Also the second processing unit 150 illustrated in FIG. 12 is a two-frequency plasma etching apparatus.

As shown in FIG. 12, also the second processing unit 150 includes a processing chamber 1a (corresponding to an example of a second processing chamber), a gate valve 17a (corresponding to an example of a second gate valve) that closes a carry-in/out port 9a (corresponding to an example of a second carry-in/out port) provided at the processing chamber 1a, a gas supply unit 18a (corresponding to an example of a second supply unit) that supplies a chlorine-containing gas into the processing chamber 1a, an exhaust unit 19a (corresponding to an example of a second exhaust unit) that exhausts the interior of the processing chamber 1a, etc.

In the second processing unit 150, the electrode unit 4, the processing chamber 1a, the high-frequency power source 6b, the high-frequency power source 6c, the coil 20, etc. constitute a plasma generation unit (corresponding to an example of a second plasma generation unit) that generates plasma P in the processing chamber 1a.

One exhaust unit may be provided for the first processing unit 140, the second processing unit 150, and the third processing unit 180 described later. Even in the case where the exhaust unit is shared, the exhaust amount, the exhaust speed, etc. can be individually controlled by the pressure controller 8 provided in each of the first processing unit 140, the second processing unit 150, and the third processing unit 180.

The main configuration of the second processing unit 150 may be similar to that of the first processing unit 140, and a detailed description is therefore omitted.

In the case where a layer (e.g., the absorber layer 204a) including tantalum boron nitride (TaBN) is etching-processed in the second processing unit 150, a processing gas G2 (corresponding to an example of a second gas) may be a chlorine-containing gas. For example, the processing gas G2 may be $Cl_2$, $CCl_4$, HCl, or the like or a mixed gas thereof.

Here, in the case where a layer including tantalum boron nitride (TaBN) is etching-processed using a chlorine-containing gas, by-products generated are in a small amount. That is, by-products adhering to the side wall, bottom, and the like of the processing chamber 1a are in a small amount. Therefore, it is possible not to provide the partition unit 12 and the raising/lowering unit 11 in the second processing unit 150.

If the partition unit 12 and the raising/lowering unit 11 are not provided, the exhaust of the processing gas G2 is smoother. Therefore, since the flow rate and exhaust amount of the processing gas G2 can be increased, matters etching-removed can be rapidly discharged. That is, by increasing the flow rate and exhaust amount of the processing gas G2, the re-adhesion of matters once etching-removed to etching-processed portions or the like can be suppressed. Consequently, the dimensional controllability in etching processing can be improved.

In this case, the flow rate of the processing gas G2 may be set to approximately 180 sccm.

If the partition unit 12 and the raising/lowering unit 11 are provided, the entry of particles and the like into the processing space 3 from the outside can be suppressed. Therefore, similarly to what is described above, it is also possible to provide the partition unit 12 and the raising/lowering unit 11.

The high-frequency power source 6c connected to the coil 20 may be one that applies a smaller high-frequency electric power than the high-frequency power source 6a described above. For example, the high-frequency power source 6c may be one that applies a high-frequency electric power of approximately 1 KW having a frequency of approximately 100 KHz to 100 MHz to the coil 20.

It is also possible to connect the high-frequency power source 6a described above to the coil 20 to control the high-frequency electric power applied.

Next, the third processing unit 180 is illustrated.

The configuration of the third processing unit 180 may be similar to the configuration of the second processing unit 150. That is, herein illustration and a description of the configuration omitted, also the third processing unit 180 includes the processing chamber 1a (corresponding to an example of a third processing chamber), the gate valve 17a (corresponding to an example of a third gate valve) that closes the carry-in/out port 9a (corresponding to an example of a third carry-in/out port) provided at the processing chamber 1a, the gas supply unit 18a (corresponding to an example of a third supply unit) that supplies a gas containing chlorine and oxygen (corresponding to an example of a third gas) or a chlorine-containing gas (corresponding to an example of a fourth gas) into the processing chamber 1a, the exhaust unit 19a (corresponding to an example of a third exhaust unit) that exhausts the interior of the processing chamber 1a, etc.

In this case, also in the third processing unit 180, the electrode unit 4 (illustration omitted), the processing chamber 1a, the high-frequency power source 6a, the high-frequency power source 6b, the coil 20, etc. constitute a plasma generation unit (corresponding to an example of a third plasma generation unit) that generates plasma P in the processing chamber 1a.

Also the third processing unit 180 may include the partition unit 12 and the raising/lowering unit 11. However, in the third processing unit 180, since a layer (e.g., the reflection layer 202) in which molybdenum (Mo) layers and silicon (Si) layers are alternately stacked is etching-processed, the type of the processing gas supplied is different.

In this case, the processing gas may be a gas containing chlorine and oxygen. The additive amount of oxygen may be set not less than 5 vol % and not more than 30 vol %. As the chlorine-containing gas, for example, $Cl_2$, $CCl_4$, HCl, and the like may be illustrated.

Furthermore, for example, when the total thickness of the absorber layer 204 described above is approximately 70 nm, the thickness of the capping layer 203 is approximately 10 nm, the total thickness of the reflection layer 202 is approximately 280 nm, and the thickness of the resist is 420 nm or more, by setting the additive amount of oxygen not less than 5 vol % and not more than 30 vol %, at least the number of times of re-formation of the resist pattern can be greatly reduced.

As described previously, in the case where in the reflection layer 202, the silicon (Si) layer is oxidized and the silicon oxide ($SiO_2$) layer is formed, the gas containing fluorine (for example, $CF_4$, $CHF_3$, $NF_3$ or the like and a mixed gas of these gases) can be further added to the gas containing chlorine and oxygen.

In this case, the additive amount of $CF_4$ being the gas containing fluorine to chlorine can be 5 vol % or more and 40 vol % or less.

Then, while maintaining the selectivity to the resist, molybdenum (Mo) and silicon (Si) can be removed with the generally same etching rate.

Furthermore, compared with the case of etching processing using the gas containing chlorine and aoxygen, the etching rate of the silicon oxide ($SiO_2$) layer can be nearly ten tikes higher. the etching processing not remaining the silicon oxide ($SiO_2$) layer as the residue can be performed.

In the case where the capping layer 203 described above is formed of silicon (Si), the capping layer 203 may be etching-processed in the third processing unit 180. In this case, the processing gas may be a chlorine-containing gas. As the chlorine-containing gas, for example, $Cl_2$, $CCl_4$, HCl, and the like may be illustrated.

In the case where a film of silicon oxide is formed at the surface of the capping layer 203, removing the film of silicon oxide is difficult if an oxygen-containing gas is used. Therefore, also in such a case, a chlorine-containing gas may be used as the processing gas.

Alternatively, the etching processing using the gas containing fluorine can also remove the silicon oxide film formed on the surface of the capping layer 203.

(Working of the Apparatus for Manufacturing a Reflective Mask 100)

Next, the working of the apparatus for manufacturing a reflective mask 100 is illustrated.

In this case, as an example, a description is given using the case where the object to be processed W is the mask blank 200 and etching processing is performed on the mask blank 200 to manufacture the reflective mask 210. Furthermore, as an example, the case is illustrated where the substrate 201 is formed of a low thermal expansion material (LTEM), the reflection layer 202 includes a molybdenum (Mo) layer and a silicon (Si) layer, the capping layer 203 is formed of silicon (Si), the absorber layer 204a is formed of tantalum boron nitride (TaBN), and the anti-reflection layer 204b is formed of tantalum boron oxide (TaBO).

The basic working of the load lock unit 110, the transfer unit 120, and the carrying unit 130 may be similar to those of known art, and a description of the working thereof is therefore omitted.

First, the pattern region 216 described above is formed.

In the first processing unit 140, the etching processing on the anti-reflection layer 204b (a layer including tantalum boron oxide (TaBO)) is performed.

In the first processing unit 140, the partition unit 12 is raised to the raising end position by the raising/lowering unit 11 (see FIG. 10).

The door 13 of the gate valve 17 is opened by the not-shown gate opening/closing mechanism. At this time, although particles, contaminants, and the like adhering to the door 13 and the seal member 14 may be scattered, the partition unit 12 can partition the processing space 3, and therefore the scatter of particles, contaminants, and the like in the processing space 3 can be suppressed.

Next, the partition unit 12 is lowered (see FIG. 11). By lowering the partition unit 12 after the particles and the like scattered when the door 13 of the gate valve 17 is opened settle down, the entry of particles and the like into the processing space 3 can be suppressed.

The mask blank 200 is carried into the processing chamber through the carry-in/out port 9 by the carrying unit 130.

The mask blank 200 is mounted on the electrode unit 4, and held by the not-shown holding mechanism provided in the electrode unit 4.

The carrying unit 130 is moved to the outside of the processing chamber 1.

The partition unit 12 is raised to the raising end position by the raising/lowering unit 11 (see FIG. 10).

The door 13 of the gate valve 17 is closed. Although contaminants such as particles may be generated when the door 13 is closed, the partition unit 12 can partition the processing space 3, and therefore the scatter of particles and contaminants in the processing space 3 can be suppressed.

The interior of the processing chamber 1 is exhausted. At this time, a flow of exhaust is formed also on the outside of the partition unit 12. Therefore, contaminants such as particles generated by opening the door 13 are carried by the exhaust flow formed outside the partition unit 12, and discharged to the outside of the processing chamber 1 through the exhaust port 7.

The processing space 3 on the inside of the partition unit 12 is exhausted via a gap formed between the end surface on the inner periphery side of the bottom portion 12b and the insulating ring 5. At this time, since the plasma processing section 3 is partitioned by the partition unit 12, the entry of contaminants such as particles existing outside the partition unit 12 into the processing space 3 can be suppressed.

Next, a fluorine-containing gas is used to etching-process the anti-reflection layer 204b.

That is, first, the processing gas G1 is supplied from the gas supply unit 18 into the processing space 3 via the processing gas introduction port 2. The processing gas G1 may be a fluorine-containing gas. For example, the processing gas G1 may be $CF_4$, $CHF_3$, $NF_3$, or the like or a mixed gas thereof. The flow rate of the processing gas G1 may be set to approximately 60 sccm.

Next, a high-frequency electric power having a frequency of approximately 100 KHz to 100 MHz is applied to the coil 20 by the high-frequency power source 6a. Furthermore, a high-frequency electric power having a frequency of approximately 100 KHz to 100 MHz is applied to the electrode unit 4 by the high-frequency power source 6b. The frequencies of the high-frequency electric powers applied by the high-frequency power source 6a and the high-frequency power source 6b are preferably set to the same value. For example, the frequencies of the high-frequency electric powers applied by the high-frequency power source 6a and the high-frequency power source 6b may be set to 13.56 MHz.

The high-frequency power source 6a may be one that applies a high-frequency electric power of approximately 3 KW, and the high-frequency power source 6b may be one that applies a high-frequency electric power of approximately 1 KW.

Thereby, since the electrode unit 4 and the processing chamber 1 constitute a capacitively coupled electrode, a discharge occurs between the electrode unit 4 and the processing chamber 1. Furthermore, since the coil 20 forms an inductively coupled electrode, a high-frequency electric power is introduced into the processing chamber 1 from the coil 20 via the dielectric window 21. Therefore, plasma P is generated in the processing space 3 by the discharge generated between the electrode unit 4 and the processing chamber 1 and the high-frequency electric power introduced into the processing chamber 1. The generated plasma P excites and activates the processing gas G1 to generate reaction products such as neutral active species, ions, and electrons. The generated reaction products go down in the processing space 3 to reach the portion to be etching-processed of the mask blank 200; thereby, etching processing is performed. The control of the plasma P is carried out by controlling reflected waves with not-shown tuning circuits provided in the matching boxes 16 and 16a. The residual processing gas G1 and most of the reaction products and by-products are discharged from the exhaust port 7 to the outside of the processing chamber 1 via a gap formed between the end surface on the inner periphery side of the bottom portion 12b and the insulating ring 5.

In the etching processing in the first processing unit 140, part of the anti-reflection layer 204b is removed based on the pattern configuration of the EB resist 211 formed on the surface of the anti-reflection layer 204b. That is, portions of the anti-reflection layer 204b not covered with the EB resist 211 are etching-processed.

After the etching processing of the anti-reflection layer 204b is finished, a purge gas or the like is introduced through the processing gas introduction port 2 so that the pressure in the processing chamber 1 and the pressure outside the door 13 of the gate valve 17 may be almost equal. It is preferable to set the pressure in the processing chamber 1 slightly higher because this can suppress the entry of contaminants such as particles into the processing chamber 1 when the door 13 is opened.

Next, the door 13 of the gate valve 17 is opened by the not-shown gate opening/closing mechanism. Although contaminants such as particles may be generated when the door 13 is opened, the partition unit 12 can partition the processing space 3, and therefore the scatter of particles, contaminants, and the like in the processing space 3 can be suppressed.

Next, the partition unit 12 is lowered (see FIG. 11).

Then, the mask blank 200 in which etching processing has been performed on the anti-reflection layer 204b is carried out by the carrying unit 13.

After that, the door 13 of the gate valve 17 may be closed by the following procedure until the mask blank 200 to be next etching-processed is carried in.

That is, first, the partition unit 12 is raised to the raising end position by the raising/lowering unit 11 (see FIG. 10).

Next, the door 13 of the gate valve 17 is closed by the gate opening/closing mechanism. Although contaminants such as particles may be generated when the door 13 is closed, the partition unit 12 can partition the processing space 3, and therefore the scatter of particles and contaminants in the processing space 3 can be suppressed.

Next, in the second processing unit 150, the etching processing on the absorber layer 204a is performed.

The mask blank 200 that has undergone etching processing in the first processing unit 140 is carried into the second processing unit 150.

That is, the carrying unit 130 carries the mask blank 200 from which the anti-reflection layer 204b has been removed so as to be in a prescribed configuration out of the first processing unit 140, and carries the mask blank 200 carried out of the first processing unit 140 into the second processing unit 150.

In the etching processing in the second processing unit 150, part of the absorber layer 204a is removed based on the pattern configuration of the EB resist 211 described above. That is, portions of the absorber layer 204a where there is not the EB resist 211 on the upper side are etching-processed.

In this case, a chlorine-containing gas is supplied from the gas supply unit 18a as the processing gas G2 to perform the etching-process on the absorber layer 204a. The chlorine-containing gas may be, for example, $Cl_2$, $CCl_4$, HCl, or the like or a mixed gas thereof. The flow rate of the chlorine-containing gas may be set to approximately 180 sccm.

Thus, the formation of the pattern region 216 is performed.

The basic working of the second processing unit 150 may be almost similar to the working of the first processing unit 140, and a detailed description is therefore omitted.

The mask blank 200 with the pattern region 216 formed is carried out of the second processing unit 150, and the residual EB resist 211 is removed. Then, a defect inspection, the remedy of defect portions, etc. are performed as necessary.

After that, the resist 212 having a prescribed pattern for forming the light blocking region 217 is formed on the surface of the mask blank 200.

Next, the light blocking region 217 is formed.

First, similarly to the case of forming the pattern region 216 described above, the etching processings on the anti-reflection layer 204b and the absorber layer 204a are performed. More specifically, the etching processing on the anti-reflection layer 204b is performed in the first processing unit 140, and the etching processing on the absorber layer 204a is performed in the second processing unit 150.

The working of the first processing unit 140 and the working of the second processing unit 150 in performing these etching processings may be similar to those described above, and a detailed description is therefore omitted.

Next, the etching processings on the capping layer 203 and the reflection layer 202 are sequentially performed in the third processing unit 180.

First, part of the capping layer 203 is removed based on the pattern configuration of the resist 212 described above. More specifically, portions of the capping layer 203 where there is not the resist 212 on the upper side are etching-processed.

In this case, a chlorine-containing gas may be used as the processing gas. As the chlorine-containing gas, for example, $Cl_2$, $CCl_4$, HCl, and the like may be illustrated. As described above, also in the case where a film of silicon oxide is formed at the surface of the capping layer 203, etching processing using a chlorine-containing gas or a fluorine-containing gas may be performed.

Next, part of the reflection layer 202 is removed. More specifically, portions of the reflection layer 202 where there is not the resist 212 on the upper side are etching-processed.

In this case, a gas containing chlorine and oxygen may be used as the processing gas. As the chlorine-containing gas, for example, $Cl_2$, $CCl_4$, HCl, and the like may be illustrated.

By setting the additive amount of oxygen not less than 5 vol % and not more than 30 vol %, the etching-processed surface becoming in a comb teeth shape can be suppressed.

Furthermore, for example, when the total thickness of the absorber layer 204 is approximately 70 nm, the thickness of the capping layer 203 is approximately 10 nm, the total thickness of the reflection layer 202 is approximately 280 nm, and the thickness of the resist is 420 nm or more, by setting the additive amount of oxygen not less than 5 vol % and not more than 30 vol %, at least the number of times of re-formation of the resist pattern can be greatly reduced.

As described previously, in the case where in the reflection layer 202, the silicon (Si) layer is oxidized and the silicon oxide ($SiO_2$) layer is formed, the gas containing fluorine (for example, $CF_4$, $CHF_3$, $NF_3$ or the like and a mixed gas of these gases) can be further added to the gas containing chlorine and oxygen.

In this case, the additive amount of $CF_4$ being the gas containing fluorine to chlorine can be 5 vol % or more and 40 vol % or less.

Then, while maintaining the selectivity to the resist, molybdenum (Mo) and silicon (Si) can be removed with the generally same etching rate.

Furthermore, compared with the case of etching processing using the gas containing chlorine and aoxygen, the etching rate of the silicon oxide ($SiO_2$) layer can be nearly ten tikes higher. the etching processing not remaining the silicon oxide ($SiO_2$) layer as the residue can be performed.

The basic working of the third processing unit 180 may be almost similar to the working of the second processing unit 150, and a detailed description is therefore omitted.

It is also possible to provide a processing unit that performs etching processing on the capping layer 203 and a processing unit that performs etching processing on the reflection layer 202 and to perform etching processing in these processing units.

According to the embodiments illustrated in the above, a method for manufacturing a reflective mask and an apparatus for manufacturing the reflective mask can be provided to improve productivity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination one another.

For example, the shape, dimensions, material, arrangement, number, etc. of the components of the mask blank 200, the reflective mask 210, the manufacturing apparatus 160, the manufacturing apparatus 100, etc. are not limited to those illustrated, and may be altered as appropriate.

What is claimed is:

1. A method for manufacturing a reflective mask comprising a substrate, a reflection layer formed on a major surface of the substrate, the reflection layer including a first layer and a second layer, the first layer including molybdenum, the second layer including silicon, the first layer and the second layer being alternately stacked, an absorption layer formed on the reflection layer, a pattern region formed in the absorption layer, the method comprising:

forming a light blocking region surrounding the pattern region in the absorption layer and the reflection layer; and the forming the light blocking region including etch-processing both the first layer and the second layer using a gas containing chlorine atom, oxygen atom, and fluorine atom, and an additive amount of a gas including the oxygen atom being set not less than 5 vol % and not more than 30 vol %, and an additive amount of the gas containing fluorine atom to a gas containing chlorine atom being set not less than 5 vol % and not more than 40 vol % in the forming the light blocking region.

2. The method according to claim 1, wherein
the absorption layer includes an absorber layer including a nitride of tantalum and an anti-reflection layer including an oxide of tantalum and
the absorber layer and the anti-reflection layer are etch-processed in environments separated from each other, respectively, in the forming the pattern region.

3. The method according to claim 1, wherein the absorber layer, the anti-reflection layer, and the reflection layer are etch-processed in environments separated from each other, respectively, in the forming the light blocking region.

4. The method according to claim 3, wherein an environment for etch-processing the absorber layer in the forming the light blocking region is the same environment as an environment for etch-processing the absorber layer in the forming the pattern region.

5. The method according to claim 3, wherein an environment for etch-processing the anti-reflection layer in the forming the light blocking region is the same environment as an environment for etch-processing the anti-reflection layer in the forming the pattern region.

6. The method according to claim 2, wherein an oxygen concentration in an environment between an environment for etch-processing the absorber layer and an environment for etch-processing the anti-reflection layer is lower than an oxygen concentration of atmosphere.

7. The method according to claim 1, wherein a capping layer is further provided between the reflection layer and the absorption layer, and
the forming the light blocking region includes etch-processing an oxide film formed at the capping layer using a chlorine-containing gas or a fluorine-containing gas.

8. The method according to claim 7, wherein
the capping layer includes silicon and
an environment for etch-processing the capping layer is the same environment as an environment for etch-processing the reflection layer in the forming the light blocking region.

9. The method according to claim 2, wherein the environments are separated from each other so as to prevent a by-product generated in one etch-processing from entering an environment for performing another etch-processing.

10. The method according to claim 2, wherein
plasma etch-processing using a fluorine atom-containing gas is performed in etching the anti-reflection layer in the forming the pattern region and the forming the light blocking region and
plasma etch-processing using a chlorine atom-containing gas is performed in etching the absorber layer in the forming the pattern region and the forming the light blocking region.

* * * * *

UNITED STATES PATENT AND TRADEMARK OFFICE
CERTIFICATE OF CORRECTION

PATENT NO. : 9,507,251 B2
APPLICATION NO. : 14/197549
DATED : November 29, 2016
INVENTOR(S) : Tomoaki Yoshimori et al.

Page 1 of 1

It is certified that error appears in the above-identified patent and that said Letters Patent is hereby corrected as shown below:

On the Title Page

Item (73) Assignees, replace "KABUSHIKI KAISHA TOPCON" with -- KABUSHIKI KAISHA TOSHIBA --.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*